(12) United States Patent
Smith et al.

(10) Patent No.: US 11,336,290 B2
(45) Date of Patent: May 17, 2022

(54) AMPLIFIER AMPLITUDE DIGITAL CONTROL FOR A MASS SPECTROMETER

(71) Applicant: Thermo Finnigan LLC, San Jose, CA (US)

(72) Inventors: Johnathan W. Smith, Round Rock, TX (US); Scott T. Quarmby, Round Rock, TX (US); Dustin J. Kreft, Round Rock, CA (US); Michael W. Senko, Sunnyvale, CA (US)

(73) Assignee: Thermo Finnigan LLC, San Jose, CA (US)

( * ) Notice: Subject to any disclaimer, the term of this patent is extended or adjusted under 35 U.S.C. 154(b) by 0 days.

(21) Appl. No.: 16/833,731

(22) Filed: Mar. 30, 2020

(65) Prior Publication Data
US 2021/0305991 A1    Sep. 30, 2021

(51) Int. Cl.
H03M 1/06      (2006.01)
G01J 3/433     (2006.01)

(52) U.S. Cl.
CPC ......... H03M 1/0636 (2013.01); G01J 3/4338 (2013.01); G01J 2003/4332 (2013.01)

(58) Field of Classification Search
CPC ................ H03M 1/0636; G01J 3/4338; G01J 2003/4332
USPC ..................................................... 455/226.4
See application file for complete search history.

(56) References Cited

U.S. PATENT DOCUMENTS

| 6,870,159 | B2 | 3/2005 | Kawato |
| 7,161,142 | B1 | 1/2007 | Patterson et al. |
| 7,973,277 | B2 | 7/2011 | Rafferty |
| 8,487,249 | B2 | 7/2013 | Gershwann et al. |
| 8,907,274 | B2 | 12/2014 | Mizutani |
| 9,030,056 | B2 | 5/2015 | Thomsen et al. |
| 10,134,573 | B2 | 11/2018 | Gordon et al. |
| 10,262,849 | B2 | 4/2019 | Christopher et al. |
| 2005/0263698 | A1 | 12/2005 | Kawato |
| 2006/0016985 | A1* | 1/2006 | Roushall ............... H01J 49/022 250/292 |

(Continued)

FOREIGN PATENT DOCUMENTS

CN    107785229 B    12/2019
EP    0330774 A1     9/1989

(Continued)

OTHER PUBLICATIONS

Johnson et al., "Active Stabilization of Ion Trap Radiofrequency Potentials" Review of Scientific Instruments, 2016, No. 87, 7 pages.

(Continued)

Primary Examiner — Ankur Jain

(57) ABSTRACT

Control of an amplitude of a signal applied to rods of a quadrupole is described. In one aspect, a mass spectrometer includes an amplifier circuit that causes a radio frequency (RF) signal to be applied to the rods of the quadrupole based on an amplifier RF input signal. An analog-to-digital converter (ADC) can generate a digital representation of the RF signal. A controller circuit can receive the digital representation and adjust an amplitude of the amplifier RF input signal based on differences between an amplitude of a fundamental frequency of the RF signal being different than an expected amplitude.

18 Claims, 10 Drawing Sheets

(56) References Cited

U.S. PATENT DOCUMENTS

| | | | | |
|---|---|---|---|---|
| 2008/0001083 A1* | 1/2008 | Schaefer | ............ | H01J 49/0031 250/290 |
| 2012/0145892 A1* | 6/2012 | Gershman | ........... | H01J 49/4275 250/282 |
| 2013/0311141 A1 | 11/2013 | Peng | | |
| 2014/0252220 A1* | 9/2014 | Rafferty | ................ | H01J 49/022 250/282 |
| 2016/0293393 A1 | 10/2016 | Gordon et al. | | |
| 2020/0203142 A1 | 6/2020 | Langridge et al. | | |

FOREIGN PATENT DOCUMENTS

| | | | |
|---|---|---|---|
| JP | 2002033072 | A | 1/2002 |
| JP | 5152335 | B2 | 2/2013 |
| JP | 2014022162 | A | 2/2014 |
| JP | 6047414 | B2 | 12/2016 |
| WO | 2007130649 | A2 | 11/2007 |
| WO | 2011086108 | A1 | 7/2011 |
| WO | 2015040382 | A1 | 3/2015 |

OTHER PUBLICATIONS

Hendricks, Paul Issac, "Development of a Field-Portable Miniature Mass Spectrometer Designed for In-Situ Analysis and Ion Trap Miniaturization", Dissertation Submitted to the Faculty of Purdue University on Dec. 2013, 246 pages.

Schaefer et al. "Digitally Synthesized High Purity, High-Voltage Radie Frequency Drive Electronics for Mass Spectrometry," Review of Scientific Instruments, 2008, No. 79, 7 pages.

Danell et al. "Operational Parameters, Considerations, and Design Decisions for Resource-Constrained Ion Trap Mass Spectrometers," Jan. 1, 2011, 4 pages.

Robbins et al., "Computer-controlled, Variable-frequency Power Supply for Driving Multipole Ion Guides", Review of Scientific Instruments, 2008, No. 79, 7 pages.

Prasad et al., "Technical Report on the Paul Trap Mass Spectrometer Developed in the Mass Spectrometry Laboratory," Department of Instrumentation, Indian Institute of Science, Bangalore, Mar. 2003.

Extended EP Search Report dated Aug. 23, 2021, to EP Patent Application No. 21165459.5.

Extended EP Search Report dated Aug. 23, 2021, to EP Patent Application No. 21163923.2.

* cited by examiner

AMPLIFIER AMPLITUDE DIGITAL CONTROL FOR A MASS SPECTROMETER

TECHNICAL FIELD

This disclosure relates to mass spectrometry, and more particularly to controlling an amplitude of a radio frequency (RF) signal applied to mass analyzers, ion guides, and ion traps of a mass spectrometer.

BACKGROUND

Mass spectrometry is an analytical technique used to measure the mass-to-charge ratios (m/z) of ions. Typically, a sample is introduced into an ion source of the mass spectrometer to be ionized. The resulting ions are then subject to transport, confinement, and separation by various components of the mass spectrometer. Typically, radio frequency (RF) signals, as well as direct current (DC) signals, are applied to electrodes of the components to generate electric fields used to manipulate the ions for transport, confinement, and separation.

For example, some mass spectrometers use a quadrupole mass filter, a set of four parallel rods, as a mass analyzer to separate the ions according to their m/z. Two of the four rods of the quadrupole are applied a first oscillating RF signal, and the other two rods are applied another oscillating RF signal that is 180° out-of-phase from the first RF signal. The application of the RF signals, together with the resolving DC signal, applied in opposite polarities to the rod pairs, generates an oscillating electric field that causes the transmission of selected ions through the quadrupole based on the m/z of the ions, amplitudes of the RF and the resolving DC signals, and the frequency of the RF signals.

A RF amplifier circuit can generate the RF signal with an amplitude in the thousands of volts used to generate the oscillating electric field to resolve larger masses. The accuracy and precision of the RF signal allows for the proper generation of the oscillating electric field. Analog feedback circuitry can sample the RF signal and adjust the amplifier using a feedback loop to ensure that the actual amplitude is the same as or close to the expected amplitude. Unfortunately, the analog feedback circuitry can include several components and, therefore, increases costs. Additionally, the analog feedback circuitry has a relatively slow response time. Thus, the actual amplitude of the RF signal is not quickly adjusted to the expected amplitude, thereby reducing the performance of the mass spectrometer.

SUMMARY

One innovative aspect of the subject matter described in this disclosure includes an apparatus, including: an amplifier circuit configured to cause a radio frequency (RF) signal to drive a quadrupole mass analyzer based on an amplifier RF input signal; an analog-to-digital converter (ADC) configured to generate a digital representation of the RF signal; and a controller circuit configured to receive the digital representation of the RF signal and adjust an amplitude of the amplifier RF input signal responsive to a determination that an amplitude of a fundamental frequency of the RF signal is different than an expected amplitude.

In some implementations, the determination that the amplitude of the fundamental frequency of the RF signal is different than the expected amplitude includes applying a digital signal processing (DSP) technique to transform the digital representation of the RF signal to a frequency domain, and the amplitude of the fundamental frequency is identified from frequency components including harmonics of the RF signal.

In some implementations, the DSP technique is a discrete cosine transform (DCT).

In some implementations, the expected amplitude is an amplitude of the amplifier RF input signal.

In some implementations, the controller circuit is configured to identify a phase difference between the RF signal and the amplifier RF input signal, and adjust a frequency of the amplifier RF input signal based on the phase difference.

In some implementations, the controller circuit is configured to identify an amount of harmonic content of the RF signal, and adjust a frequency of the amplifier RF input signal based on the amount of harmonic content.

In some implementations, the controller circuit is configured to identify a harmonic of the RF signal at a first frequency, and generate an out-of-phase signal with respect to the harmonic at the first frequency onto the amplifier RF input signal to attenuate the harmonic of the RF signal.

In some implementations, the RF signal is generated via an inductor coil disposed between the amplifier circuit and the quadrupole mass analyzer.

Another innovative aspect of the subject matter described in this disclosure includes an apparatus including: an amplifier circuit configured to cause a radio frequency (RF) signal to drive a component of a mass analyzer based on an amplifier RF input signal; an analog-to-digital converter (ADC) configured to generate a digital representation of the RF signal; and a controller circuit configured to receive the digital representation of the RF signal and adjust an amplitude of the amplifier RF input signal responsive to a determination that an amplitude of a fundamental frequency of the RF signal is different than an expected amplitude.

In some implementations, the determination that the amplitude of the fundamental frequency of the RF signal is different than the expected amplitude includes applying a digital signal processing (DSP) technique to transform the digital representation of the RF signal to a frequency domain, and the amplitude of the fundamental frequency is identified from frequency components including harmonics of the RF signal.

In some implementations, the DSP technique is a discrete cosine transform (DCT).

In some implementations, the expected amplitude is an amplitude of the amplifier RF input signal.

In some implementations, the controller circuit is configured to identify a phase difference between the RF signal and the amplifier RF input signal, and adjust a frequency of the amplifier RF input signal based on the phase difference.

In some implementations, the controller circuit is configured to identify an amount of harmonic content of the RF signal, and adjust a frequency of the amplifier RF input signal based on the amount of harmonic content.

In some implementations, the controller circuit is configured to identify a harmonic of the RF signal at a first frequency, and generate an out-of-phase signal with respect to the harmonic at the first frequency onto the amplifier RF input signal to attenuate the harmonic of the RF signal.

In some implementations, the RF signal is generated via an inductor coil disposed between the amplifier circuit and a quadrupole mass analyzer.

In some implementations, the component is a multipole assembly.

In some implementations, the component is a quadrupole mass analyzer.

Another innovative aspect of the subject matter described in this disclosure includes a method including: causing a radio frequency (RF) signal to drive a component of a mass analyzer based on an amplifier RF input signal; generating a digital representation of the RF signal; determine that an amplitude of a fundamental frequency of the RF signal is different than an expected amplitude; and adjust an amplitude of the RF input signal responsive to the determination that the amplitude of the fundamental frequency of the RF signal is different than the expected amplitude.

In some implementations, the component is a multipole assembly.

DETAILED DESCRIPTION

Figure 1:
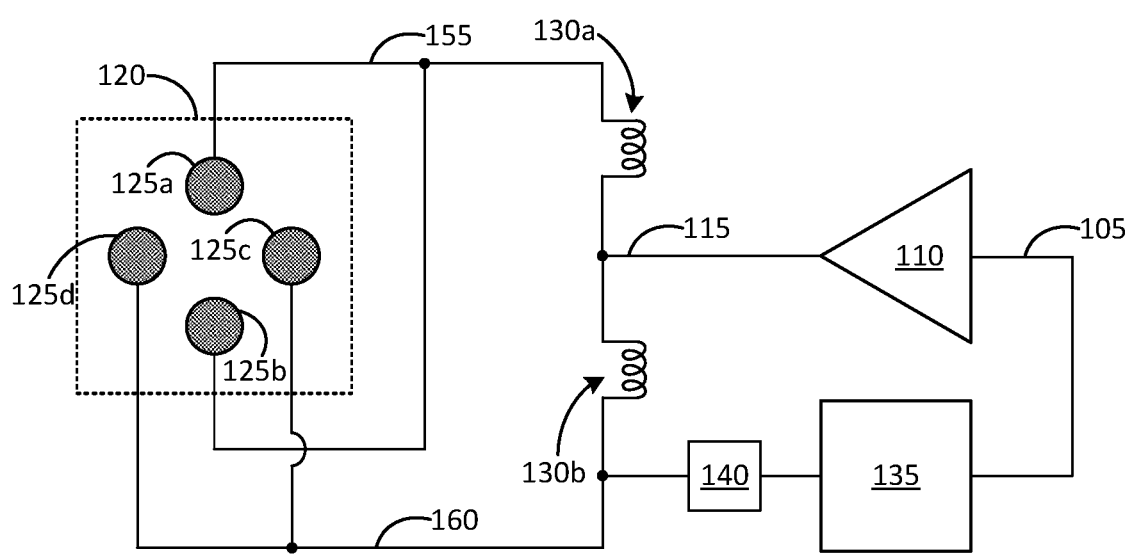
FIG. 1 illustrates an example of digital control for an amplitude of a RF signal generated by an amplifier.

Some of the material described in this disclosure includes circuits and techniques for controlling an amplitude of a signal generated by an amplifier circuit for mass spectrometry. In one example, a mass spectrometer includes an ion source used to ionize an analyte. The resulting ions are then provided to a quadrupole mass analyzer for mass analysis. The quadrupole mass analyzer includes four parallel conductive (e.g., metallic) rods. In addition to direct current (DC) resolving voltages, two of the rods are applied a radio frequency (RF) signal that is 180° out-of-phase from an RF signal applied to the two other rods of the quadrupole. The RF signals applied to the rods oscillate within a peak-to-peak amplitude, resulting in an oscillating electric field used to manipulate the ions based on their mass-to-charge ratios (m/z).

The RF signals are generated by an RF amplifier circuit and can measure in the thousands of volts (V) during the oscillation (e.g., up to a peak-to-peak amplitude of 8000 V). The RF signals are applied to the rods via an LC circuit, or a resonant circuit, modeled to include an inductor and a capacitor coupled in series to function as a resonator to store energy, magnify the voltage, and oscillate at a specific frequency.

As previously discussed, the accuracy and the precision of the amplitude of the RF signal are important to allow for the proper generation of the oscillating electric field to manipulate the ions. That is, the amplitude of the RF signal is carefully applied to ensure that ions of a particular m/z are manipulated to transit through the quadrupole. As different ions of different m/z are selected for analysis, the amplitude of the RF signal is adjusted. Unfortunately, discrepancies between the actual and expected amplitude of the RF signal generated by the amplifier circuit can occur due to environmental factors (e.g., temperature changes), component degradation over time, or other factors.

As described later in this disclosure, digital control of the amplitude of the RF signal caused by the amplifier circuit to be applied to the quadrupole is performed. For example, a controller circuit (composed of an arrangement of connected electronic components that collectively perform a desired function or operation) having digital logic functionality (e.g., implemented by a field programmable gate array (FPGA), a microprocessor, etc.) receives a digitized representation of the RF signal via an analog-to-digital converter (ADC) and determines the actual characteristics of the RF signal including its amplitude. The controller circuit can then compare the actual amplitude with the expected amplitude and, if different, access memory storing information indicating how the amplifier circuit should be driven to provide the RF signal with the expected amplitude. This results in the actual amplitude of the RF signal to adjust to be closer to, or the same as, the expected amplitude. Additionally, the controller circuit can implement digital signal processing (DSP) to identify the amplitude of the fundamental frequency of the RF signal while ignoring harmonics, allowing for more accurate driving of the amplifier for generating the RF signal.

Also described later in this disclosure, the controller circuit can determine one or both of environmental or performance characteristics at the time including temperature of the components of the mass spectrometer (e.g., temperatures of the inductor coils of the resonant circuit or the quadrupole rods, temperature of a digital-to-analog converter) or mode of operation and how that mode of operation is being performed (e.g., how a scanning mode is performed or how a selected monitoring mode is being performed). Scanning modes can include but are not limited to full scans, product ion scans, precursor scans, and neutral loss scans. Selective monitoring modes can include but are not limited to selective ion monitoring (SIM) and selective reaction monitoring (SRM). The mode of operation can include the scan rate, the starting m/z, the ending m/z, and the time spent in that mode. The mode of operation can also include what mode of operation was performed previously or what mode of operation will be performed next. One or both of the current environmental and performance characteristics, along with one or both of historical environmental and performance characteristics, can also be used to more precisely drive the amplifier to generate the RF signal.

Also described later in this disclosure, differences between phases of the actual RF signal and the RF amplifier input signal used to drive the amplifier can be determined. Differences in the phases are often the result of harmonics causing the actual RF signal to be different than the expected RF signal. This can be caused by the resonant frequency of the resonant circuit drifting during temperature changes affecting the resonant circuit's capacitance or inductance. The RF amplifier input signal can be adjusted to compensate for the phase differences, resulting in the actual RF signal to be closer to, or the same as, as the expected RF signal (e.g., at the resonant frequency).

In addition to controlling the amplitude, the frequency or phase of the actual RF signal can also be controlled using the aforementioned techniques.

By controlling the amplitude (or frequency or phase) of the RF signal via the controller circuit, the proper amplitude can be achieved much faster than when using an analog circuit to determine how to adjust the amplitude. This results in an increase in the throughput of the mass spectrometer because the "dead time" between scans is reduced. Additionally, fewer components are used, resulting in cost savings in comparison to using an analog circuit. Moreover, the controller circuit can record information related to the RF signal, the environment, and the performance, as well as access a history of past information, to make more informed decisions regarding how to adjust the amplitude. The controller circuit can also allow the mass spectrometer to self-calibrate to a level that is not achievable using analog techniques.

Figure 2:
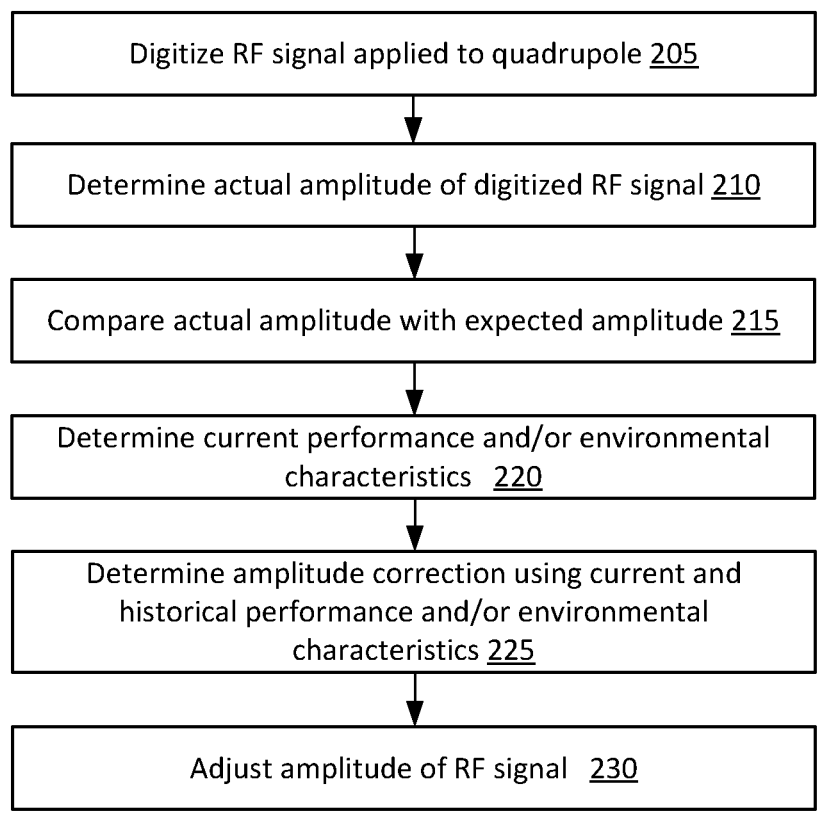
FIG. 2 illustrates an example of a block diagram for digital control of an amplitude of a RF signal.

In more detail, FIG. 1 illustrates an example of digital control for an amplitude of a RF signal generated by an amplifier. FIG. 2 illustrates an example of a block diagram for digital control of the amplitude of the RF signal of FIG. 1. In FIG. 2, a RF signal applied to a quadrupole is digitized (205). For example, in FIG. 1, RF input 105 is a signal that drives inputs of components of RF amplifier 110. In response, RF amplifier generates RF signal 115, which is a higher-power signal than RF input 105. RF signal 115 is provided to terminals of inductors 130a and 130b (both of which are out-of-phase with respect to the other such that inductors 130a and 130 provide out-of-phase signals to the corresponding rods) to cause generation of RF signals 155 and 160, respectively. Inductor 130a is coupled with rods 125a and 125b of quadrupole 120, and inductor 130b is coupled with rods 125c and 125d of quadrupole 120. Resonant circuits are implemented via the inductances of the inductors and the capacitances of the rods (implementing a LC circuit) and, therefore, the voltage of RF signal 115 is magnified to provide out-of-phase RF signals 155 and 160, for example, up to 8000 V peak-to-peak amplitude to rods 125a and 125b, and rods 125c and 125d of quadrupole 120 to generate the appropriate electric fields to manipulate ions in accordance with their m/z. The example of FIG. 1 is only one type of circuit that can be implemented. For example, RF amplifier 115 can drive a primary coil which, in turn, drives secondary coils similar to inductors 130a and 130b to generate RF signals 155 and 160. In another example, a resonant circuit need not be implemented. Rather, a non-resonant transformer or other circuit can be implemented.

As shown in FIG. 1, controller circuit 135 is provided a digitized representation of RF signal 160 via analog-to-digital converter (ADC) 140. That is, ADC 140 receives RF signal 160 in an analog format, samples it, and generates a digital representation of RF signal 160 that is provided to controller circuit 135. In FIG. 1, this is depicted as ADC 140 receiving the RF signal after inductor. Though only RF signal 160 is digitized in FIG. 1, RF signal 155 (which is out-of-phase with respect to RF signal 160, as previously discussed) can also be tapped and digitized in a similar manner.

Though depicted as a separate circuit, the functionality of ADC 140 can be implemented within controller circuit 135. In one example, ADC 140 can be a 20 megahertz (MHz) ADC to sample a 1 MHz waveform to sample enough points for the digital representation of RF signal 160. By digitizing RF signal 160 using ADC 140, new information can be determined and used to more accurately drive RF amplifier 110, which would otherwise not be possible in analog controls that are typically used with mass spectrometers.

Returning to FIG. 2, the actual amplitude of the digitized RF signal is then determined (210). For example, in FIG. 1, controller circuit 135 receives the digital representation and determines the amplitude of RF signal 160 by identifying the highest peak or amplitude in data representing points of the waveform or using other techniques as discussed later herein.

Next, in FIG. 2, the actual amplitude is compared with the expected amplitude (215). For example, in FIG. 1, controller circuit 135 compares the actual amplitude of RF signal 160 with the expected amplitude that RF signal 160 should be at for quadrupole 120 to generate an accurate and precise oscillating electric field that positions ions of a particular m/z within the stability region. The actual amplitude can differ than the expected amplitude due to changes in environmental conditions (e.g., temperature of components, noise causing interference on RF signal 160 or 155, etc.), degradation of components of the mass spectrometer, etc. If controller circuit 135 determines that the actual amplitude differs from the expected amplitude, then the actual amplitude can be adjusted to be the same as or closer to the expected amplitude by driving RF amplifier circuit 110 differently via RF input 105 (e.g., by changing the amplitude of RF input 105).

In some implementations, a variable capacitor can be included in the resonant circuit and tuned (e.g., adjust its capacitance) to modify the amplitude. Using a variable capacitor can adjust the resonant frequency, but it would more difficult (but possible) to adjust the amplitude. Additionally, a variable inductor can be implemented in the resonant circuit and adjusted to change its inductance to modify the amplitude. By ensuring that RF signal 160 is at or close to the expected amplitude, the oscillating electric field generated by quadrupole 120 can allow for more careful selection of ions of a particular m/z to transit through for mass analysis.

In FIG. 2, if the actual amplitude is different from the expected amplitude, controller circuit 135 further determines the current performance and/or environmental characteristics (220) and then determines an amplitude correction using current and historical performance and/or environmental characteristics (225). For example, controller circuit 135 can include memory, or have access to memory, storing information regarding how quadrupole 120 (or other components of the mass spectrometer) has performed in the past, and the environmental conditions of quadrupole 120 in the past. Under these historical conditions, amplifier 110 might have been driven differently (i.e., the amplitude of RF input 105 might be different) to provide the expected amplitude on RF signal 160. Thus, by comparing the current performance and environmental characteristics with the historical performance and environmental characteristics, along with the actual and expected amplitudes, an amplitude correction can be determined with all the information stored in memory, for example, via a lookup table (LUT). The amplitude correction represents how much the amplitude of RF input 105 should be adjusted such that RF signal 160 is closer to the expected amplitude. Controller circuit 135 can then adjust the amplitude of RF input 105 in accordance with the amplitude correction recommended in the LUT (e.g., increase or decrease the amplitude of RF input 105 by the amplitude correction) such that the actual amplitude of RF signal 160 is changed to get closer to, or even the same as, the expected amplitude. In the prior example, both performance and environmental characteristics are used. However, controller circuit 135 can use one or both of the performance and the environmental characteristics. For example, the amplitude correction can be determined using the current performance characteristics and the historical performance characteristics, but not use environmental characteristics (either current or historical). In another example, the amplitude correction can be determined using the current environmental characteristics and the historical environmental characteristics, but not use performance characteristics.

The environmental and performance characteristics can include a variety of parameters. For example, environmental characteristics can include the ambient temperature or even the temperature of specific components of the mass spectrometer. The temperatures of inductors 130a and 130b, along with the temperatures of rods 125a-d of quadrupole 120 affect the inductance and capacitance, respectively, of the resonant circuit and, therefore, any temperatures changes have an effect as to the amplitude of the RF signal applied to rods 125a-d. Thus, controller circuit 135 can apply the amplitude correction factor by adjusting RF input 105 in view of the temperature of the component, resulting in the amplitude of RF signal 160 to be closer to the expected amplitude. Additionally, the temperature of any readback circuitry (e.g., ADC 140) or RF amplifier 110, can also be determined and used to modify the actual amplitude of RF signal 160 to get corrected towards the expected amplitude.

The performance characteristics can include how the mass spectrometer is being used. For example, a quadrupole can be operated in a scanning or jumping mode. A full scan MS is an example of a scanning mode, while SIM and SRM are examples of jumping modes. For a scanning mode, RF signal 160 is continuously varied from a starting m/z point to an ending m/z point at a particular scan rate. For a jumping mode, RF signal 160 is stepped to a voltage for a particular m/z and held there or ramped slowly over a narrow m/z range. RF signal 160 is then changed, or jumped, to a voltage for the next m/z and this repeats until all the desired ions are analyzed. As a result, the specific mode of operation, scan rates, starting and ending m/z points (or corresponding voltages or amplitudes) can be used. Thus, how quadrupole 120 of the mass spectrometer is performing at the time that the actual amplitude of RF signal 160 is determined by controller circuit 135 is determined and used to apply the amplitude correction factor to RF input 105 (e.g., by changing the amplitude of RF input 105).

The current performance and environmental characteristics, along with amplitudes of RF input 105 and RF signal 160, can also be added to the LUT. This allows for controller circuit 135 to continually store data regarding performance and environmental characteristics, the actual amplitude, and how the amplitude correction was applied to RF input 105 (e.g., at what amplitude RF input 105 should be driven at).

By implementing much of the functionality with digital circuitry implemented by controller circuit 135 and ADC 140, the actual amplitude of RF signal 160 can be more accurately controlled, the stability and calibration of the mass spectrometer is improved, and additional control strategies can be implemented, as discussed later herein.

Figure 3:
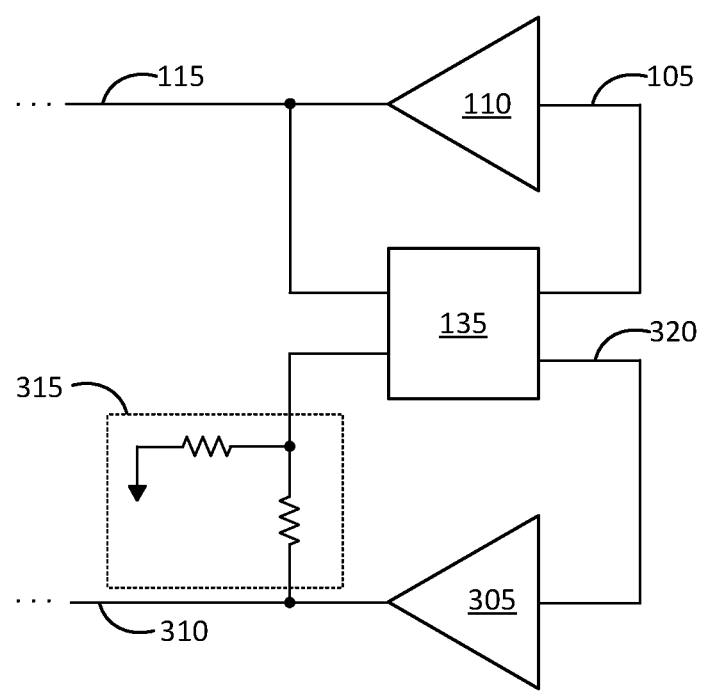
FIG. 3 illustrates an example of digital control for a direct current (DC) voltage.
Figure 4:
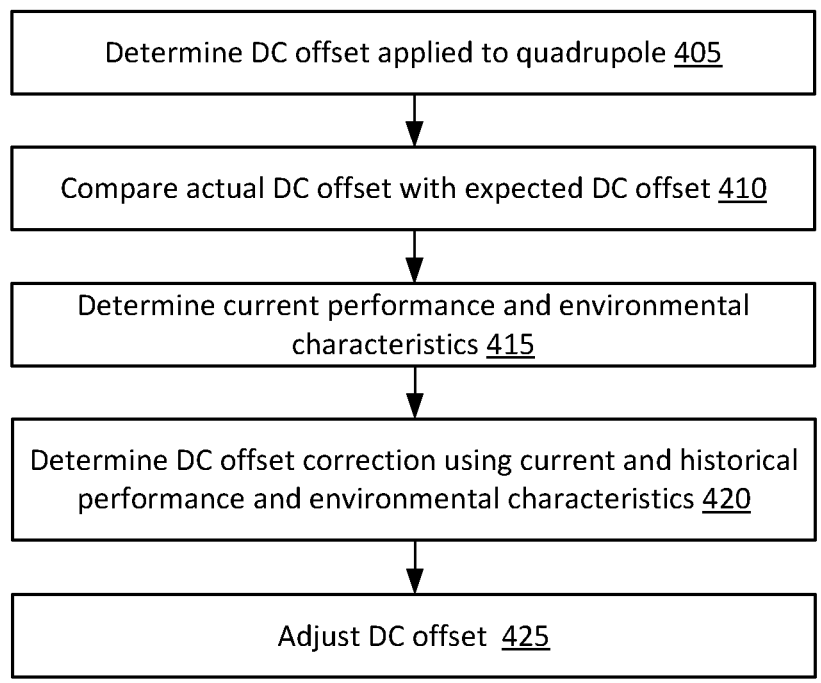
FIG. 4 illustrates an example of a block diagram for digital control for a resolving direct current (DC) voltage.

As previously discussed, resolving DC voltages are also applied to the rods of quadrupoles. Controller circuit 135 can also adjust the resolving DC voltage applied to rods 120a-d if the actual resolving DC voltage is different than the expected resolving DC voltage. FIG. 3 illustrates an example of digital control for a resolving DC voltage. FIG. 4 illustrates an example of a block diagram for digital control for a resolving DC voltage. In FIG. 4, the resolving DC voltage applied to a quadrupole can be determined (405). In FIG. 3, resolving DC voltage driver 305 provides a DC voltage signal 310 at a particular resolving DC voltage needed by quadrupole 120 to generate the electric fields used to manipulate ions. Using voltage divider 315 to divide or scale down the voltage to a level that is safely accessible to controller circuit 135, controller circuit 135 can then determine the actual voltage of DC voltage signal 310.

Returning to FIG. 4, the actual voltage is compared with the expected voltage (410), the current performance and environmental characteristics are determined (415), and a DC voltage correction is determined using the current and historical performance and environmental characteristics (420). The DC voltage correction is then used to adjust the DC voltage (425). For example, in FIG. 3, DC voltage input 320 is adjusted such that how resolving DC voltage driver 305 drives, or generates, DC voltage signal 310 is changed so that the proper resolving DC voltage is applied to the rods. Though resolving DC voltages are discussed in the aforementioned example, a DC offset that is applied to the rods to set the kinetic energy of the ions passing through the quadrupole can also be controlled in a similar manner.

Figure 5:
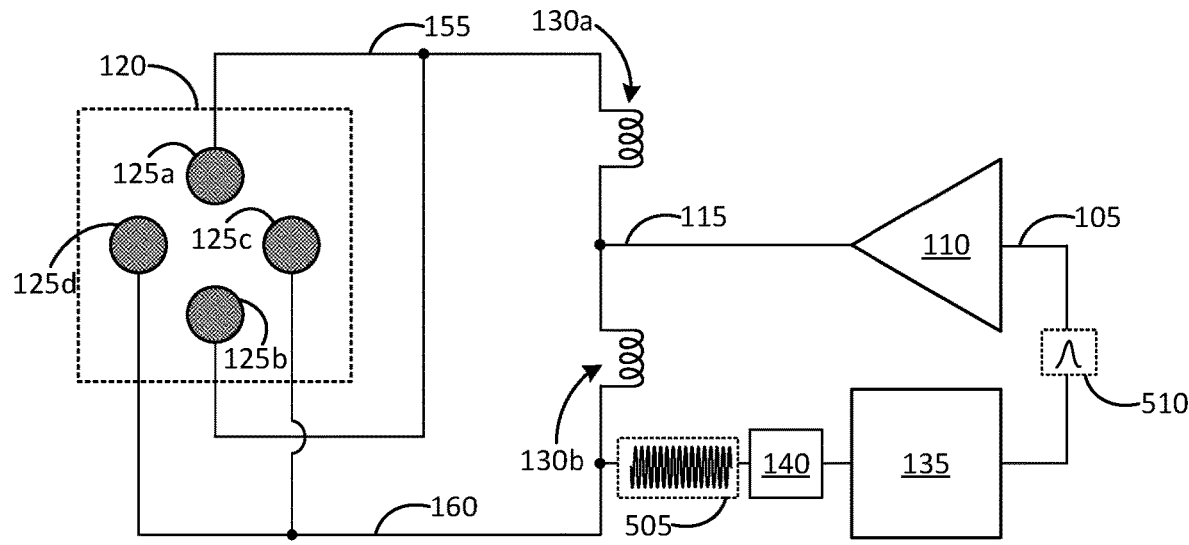
FIG. 5 illustrates an example of determining characteristics of a resonant circuit.
Figure 6:
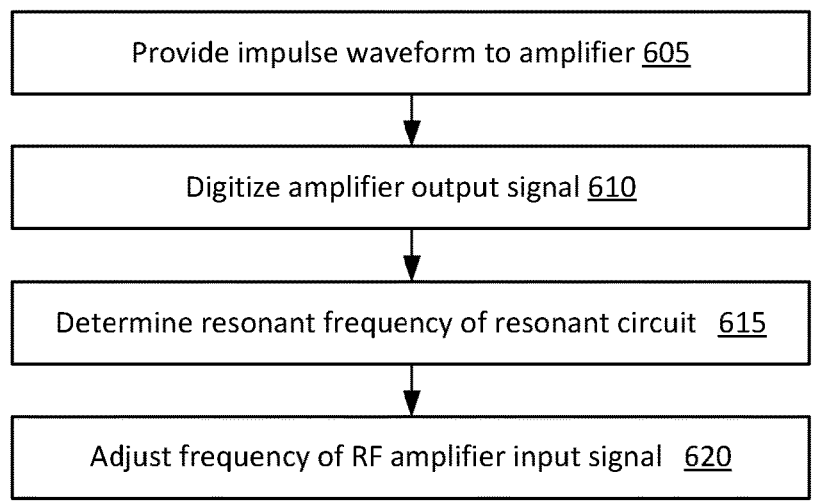
FIG. 6 illustrates an example of a block diagram for determining characteristics of a resonant circuit.

Additional functionality enabled by controller circuit 135 includes determining how the resonant circuit is performing. FIG. 5 illustrates an example of determining characteristics of a resonant circuit. FIG. 6 illustrates an example of a block diagram for determining characteristics of the resonant circuit. In FIG. 6, an impulse waveform is provided to an amplifier (605). For example, in FIG. 5, controller circuit 135 can generate impulse waveform 510 (e.g., a voltage pulse of a short time duration) as RF amplifier input 105. Next, in FIG. 6, RF signal 160 is digitized (610) and the resonant frequency of the resonant circuit is determined (615). For example, in FIG. 5, frequency 505 of RF signal 160 is determined by digitizing RF signal 160 using ADC 140. This allows for determining the frequency that the resonant circuit should resonant at, as well as allows for observation of harmonics that might be indicative of issues such as electrical cross-talk from other electrical components. The frequency of RF signal 160 provided by amplifier 110 via inductor 130b should be the same as or similar to the resonant frequency and, therefore, in FIG. 6, the frequency of the RF amplifier input signal can be adjusted (620). For example, the frequency of RF input signal 105 can be set to be the same as the resonant frequency in FIG. 5. Thus, controller circuit 135 can adjust not only the amplitude of RF input signal 105 (and subsequently, RF signals 115, 155, and 160), but also the frequency of RF input signal 105 (and, therefore, RF signals 115, 155, and 160).

Figure 11:
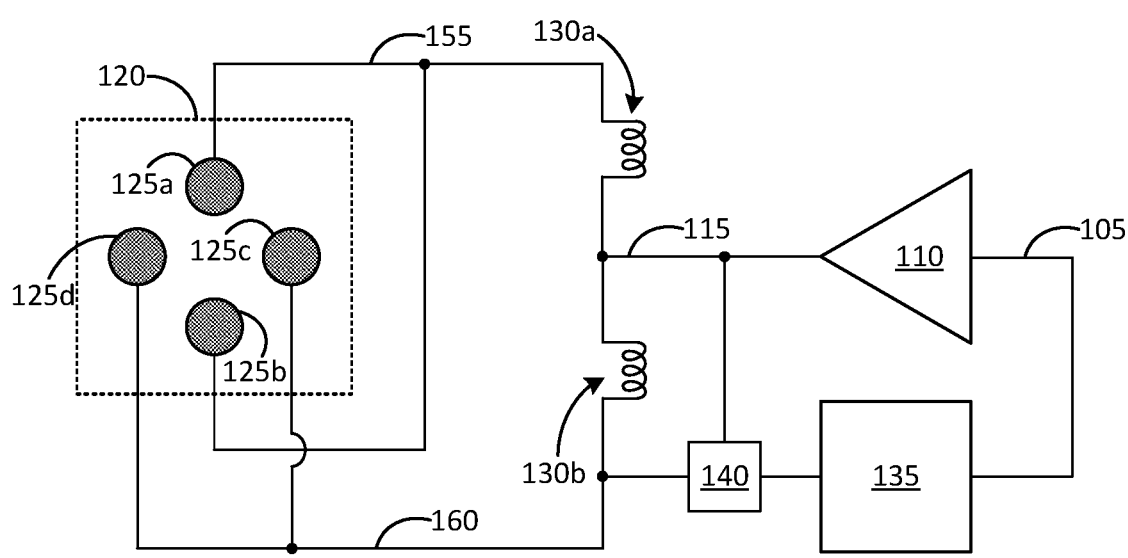
FIG. 11 illustrates another example of digital control for an amplitude of a RF signal generated by an amplifier.

The RF signal can be digitized at both terminals of the inductor coils to provide additional information and adjustments. FIG. 11 illustrates another example of digital control for an amplitude of a RF signal generated by an amplifier. In FIG. 11, RF signal 115 and RF signal 160 can both be provided to ADC 140 (or separate ADCs) for digitization and use by controller circuit 135. That is, the RF signals at both terminals of coils 130a (and/or 130b) can be digitized and considered to adjust RF input signal 105.

For example, impulse waveform 510 in FIG. 5 is provided to RF amplifier 110 as RF input signal 105 in FIG. 11, and both RF signal 115 and RF signal 160 can be digitized. By digitizing the RF signals at both terminals of inductor 130b, more information regarding the separate inductance and capacitance components of the resonant circuit can be identified.

As previously discussed, the resonant circuit is implemented via the inductances of the inductor coils and the capacitances of the rods of the quadrupole. How the inductance of the inductor coils (e.g., inductor 130b) has changed can therefore be independently determined by analyzing RF signals at both terminals of the inductor coil. For example, differences in the phase of RF signals 115 and 160 can be determined. This accounts for some change in the resonant frequency. However, any remaining change is accounted for by changes in the capacitance. Changes in capacitance are indicative of changes in the geometry of the corresponding quadrupole rods, which can cause a mass drift due to the improper generation of the oscillating electric field. Thus, controller circuit 135 can determine the change in the inductance, account for the remaining change in the resonant frequency and correlate that to the change in capacitance, and then adjust RF input signal 105 in FIG. 11 accordingly. Additionally, controller circuit 135 can also adjust the resolving DC voltage (e.g., DC voltage signal 310 in FIG. 3).

Other techniques can also be used to determine the behavior of the resonant circuit. For example, the frequency of RF signal 115 can be determined from the frequency that the mass spectrometer is operating at. Impulse waveform 510 in FIG. 5 is provided to RF amplifier 110 as RF input signal 105 in FIG. 11, and the frequency of RF signal 160 is determined. The frequency of RF signal 160 can therefore be compared with the frequency that the mass spectrometer is operating to determine the change in the resonant frequency due to the change in inductance.

Additionally, how the resonant circuit is currently performing, as well as how it has performed in the past (e.g., by recording the results of the resonant frequency as impulse waveforms are provided), can be used to determine the health of the mass spectrometer. For example, identification of harmonics can be used to identify failing capacitors or inductors, including the inductors of the resonant circuit. Degradation of components can be identified over time as the resonant frequency is determined. Additionally, any of the aforementioned information determined in the examples (e.g., amplitude of RF signal 160) can be stored and used to determine the health of the mass spectrometer. Based on the health, an alert indicating that the mass spectrometer needs maintenance can be generated (e.g., via a graphical user interface (GUI) on a monitor communicatively coupled with the mass spectrometer, via email or other communications, etc.), or even how the mass spectrometer performs can be adjusted. For example, the time to perform an operation (e.g., the scan time) can be adjusted, the voltage applied to a component can be adjusted, etc. in view of the health information. In another example, the temperature of a component (e.g., inductor coils or quadrupole rods) can be adjusted (e.g., cooled or heated via temperature adjusting devices such as fans or heaters, respectively) based on the health information as these affect the amplitude of the RF signals, as previously discussed.

The adjustment of the amplitude of RF signal 160 can be constantly monitored and maintained at the expected amplitude if any drifts of the amplitude occurs. However, in some implementations, if the difference between the actual and expected amplitudes is below a threshold amount, then controller circuit 135 might not make adjustments. This might be performed because there might be some small changes due to noise and maintaining the amplitude as-is might not significantly affect the performance of quadrupole 120.

In some implementations, the amplitude of the RF signal at the fundamental frequency can be identified. For example, using digital signal processing (DSP) techniques such as a discrete cosine transform (DCT), the RF signal as captured using the ADC in the time domain can be expressed in the frequency domain. This provides the frequency components of the RF signal. Because the fundamental frequency is the lowest frequency of a periodic waveform, and the harmonics are multiples of the frequency, the fundamental frequency can be identified separately from the harmonics and, therefore, the amplitude of the frequency component at the fundamental frequency can be determined. By identifying the amplitude without harmonics, a more accurate adjustment of the RF signal can be performed.

Figure 8:
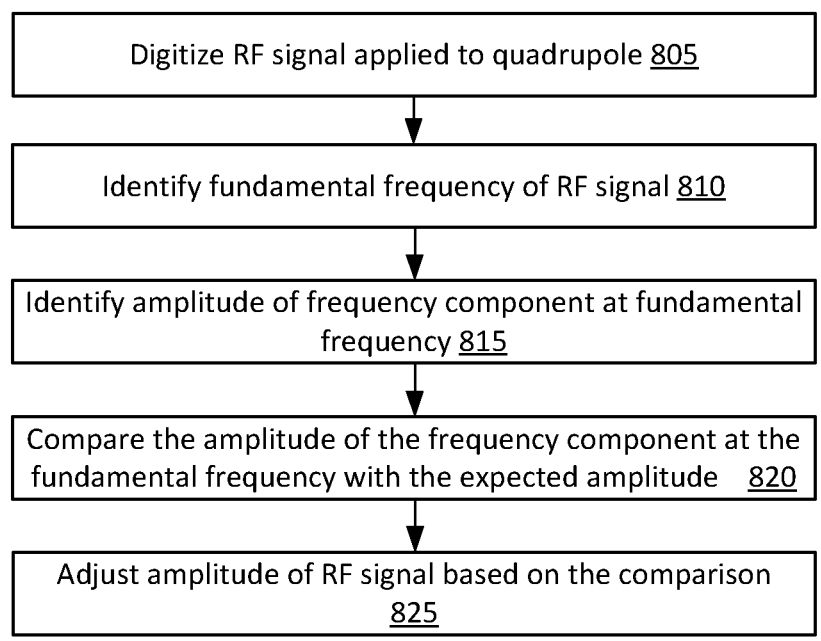
FIG. 8 illustrates an example of a block diagram for digital control of an amplitude of a RF signal by identifying harmonics.

FIG. 8 illustrates an example of a block diagram for digital control of an amplitude of a RF signal by identifying harmonics. In FIG. 8, the RF signal is digitized (805) and the fundamental frequency of the RF signal is identified (810). For example, a DCT is applied to the digital representation of the RF signal, effectively transforming the digital representation from the time domain to the frequency domain to show the amplitudes of the frequency components of the RF signal. Alternatively, a discrete Fourier transform (DFT) or a fast Fourier transform (FFT) can be applied. The fundamental frequency and its harmonics can be identified from the frequency components, and the amplitude of the frequency component at the fundamental frequency can be identified (815). For example, the lowest frequency can be the fundamental frequency. Then, a comparison of the amplitude of the frequency component at the fundamental frequency can be done with the expected amplitude of the RF signal (820). That is, a comparison of the amplitudes without harmonics can be performed by comparing the amplitude of the frequency component at the fundamental frequency and the amplitude of RF input 105. The amplitude of the RF signal can then be adjusted based on the comparison (825), for example, in a similar manner as described above.

Controller circuit can also identify other characteristics of RF signal 160 and make adjustments. For example, due to harmonics, the phase of RF signal 160 can be different than expected (e.g., different than the phase of the signal used to drive the RF amplifier). This occurs because, over time and as the capacitance and inductance of the resonant circuit change with temperature, the resonant frequency changes. Thus, the frequency of RF signal 160 can drift away from the resonant frequency of the resonant circuit and cause a phase difference. This, in turn, causes the amount of harmonic content to increase. Accordingly, by determining the phase of RF signal 160, controller circuit can adjust the frequency of RF input 105 to drive RF amplifier 110 differently such that RF signal 160 is adjusted to be more in line with expectations. Thus, in addition to adjusting the amplitude of RF signal 160 to be in line with expectations, the frequency can also be adjusted to account for changes in the resonant frequency.

Figure 9:
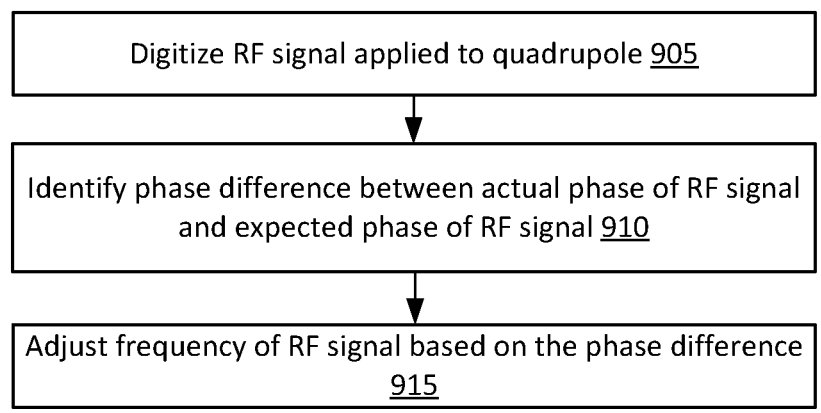
FIG. 9 illustrates an example of a block diagram for digital control of a RF signal by identifying phase differences.

FIG. 9 illustrates an example of a block diagram for digital control of a RF signal by identifying phase differences. In FIG. 9, the RF signal is digitized (905) and the phase difference between the actual phase of the RF signal and the expected phase of the RF signal is identified (910). For example, the phase difference between RF signal 160 and RF input 105 being used to drive RF amplifier 110 can be determined. Based on the phase difference, the frequency of the RF signal is adjusted (915). For example, the frequency of RF input 105 can be changed such that RF amplifier 110 is driven differently, resulting in a frequency change in RF signals 115, 155, and 160. The change in frequency introduced into RF input 105 can be based on the phase difference between the actual phase of RF signal 160 and the expected phase of RF signal 160.

In addition to determining the phase differences, the amount of harmonic content of RF signal 160 can also be determined and used to adjust RF signal 160. For example, by using a DSP technique such as DCT, as previously discussed, the different frequency components of RF signal 160 can be identified using a number of techniques including determining the total harmonic distortion (THD). This provides a value of the harmonic components of RF signal 160, though other techniques can also be used to relay the amount of harmonic content as a particular value (e.g., the number of frequency components that are harmonics, etc.). Thus, if the amount of harmonic content exceeds a threshold, then the frequency of RF signal 160 can be changed. As RF signal 160 is adjusted closer to the resonant frequency of the resonant circuit, the amount of harmonic content would be reduced. Thus, as RF signal 160 is sampled by the ADC, the amount of harmonic content can repeatedly be determined and used to adjust the frequency until the amount of harmonic content is below the threshold amount.

If too much harmonic content is identified, then this might be indicative of poor health of components of the mass spectrometer, for example, issues with the coils of the resonant circuit that cause the frequency of RF signal 160 to be significantly off the resonant frequency. Thus, an alert indicating that the mass spectrometer needs maintenance can be generated, as previously discussed.

In some implementations, controller circuit 135 can also adjust RF input 105 by introducing an out-of-phase harmonic signal to cancel or reduce a harmonic of RF signal 160. For example, if a second harmonic is identified via the frequency components, a signal that is 180 degrees out-of-phase can be generated by controller circuit 135 and superimposed on RF input 105. This out out-of-phase signal can attenuate the second harmonic observed on RF signal 160 due to the resulting destructive interference. Thus, the amount of harmonic content can be reduced and more accurate control of the quadrupole (or another component) can be provided.

In some implementations, RF amplifier 110 can be operated in a non-linear fashion, or overdriven, to quickly achieve a steady-state RF signal. Based on how much to overdrive and the current phase difference between RF signal 160 and the expected phase (or the phase of RF input 105), the phase of RF input 105 can be shifted to overdrive RF amplifier 110 for a faster transition speed to the steady-state. After the steady-state of RF signal 160 is achieved, the phase of RF input 105 can be shifted back, for example, to the resonant frequency.

Figure 7:
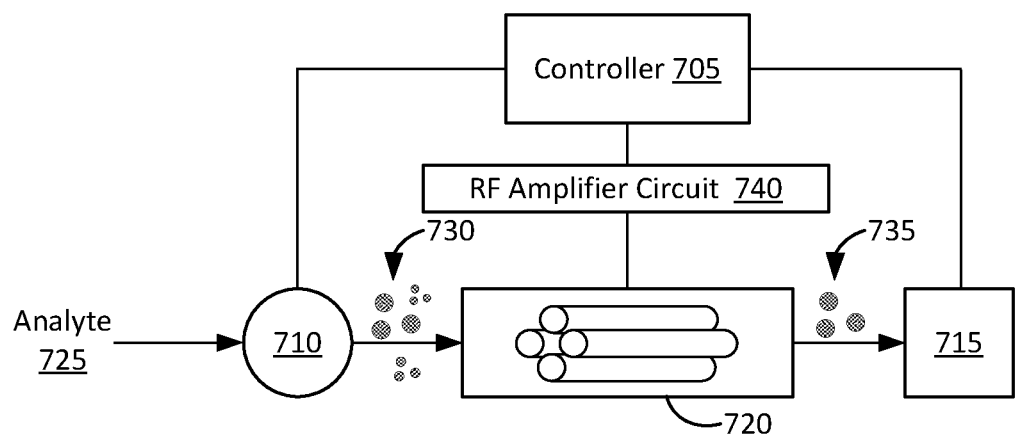
FIG. 7 illustrates an example of a mass spectrometer with digital control for an amplitude of an RF signal generated by an amplifier.

FIG. 7 illustrates an example of a mass spectrometer with digital control for an amplitude of an RF signal generated by an amplifier. In FIG. 7, a mass spectrometer includes ion source 710, quadrupole mass analyzer 720, detector 715, RF amplifier circuits 740, controller circuit 705. Controller circuit 705 includes or has access to memory storing instructions to perform the techniques described in the examples as well as any information used to perform the techniques. RF amplifier circuits 740 includes the circuitry described in the examples, including the resonant circuit, amplifier, and amplitude control circuit.

Ion source 710 receives analyte 725, for example, a peptide received from a separation device such as a liquid chromatography (LC) system and ionizes the received peptide to form ions. However, other types of analytes can be received and other separation techniques such as gas chromatography (GC) or capillary electrophoresis (CE) can also be used. The ions are then mass analyzed using mass analyzer 720 (e.g., a quadrupole). Detector 715 generates signals representative of m/z, which is interpreted by controller circuit 705 to generate or determine information that can be used to generate a mass spectrum. Other types of mass spectrometers such as tandem mass spectrometers can also be implemented.

Though quadrupole mass analyzers and filters are described in the examples, other types of mass analyzers and filters can be used with the techniques described herein. Additionally, other components of mass spectrometers that use RF signals, such as ion guides, ion traps (including 3D ion traps, linear ion traps, etc.), other multipole assemblies (including hexapoles or octupoles), stacked ring ion guides, ion funnels, etc. can also be used with the techniques described herein.

Figure 10:
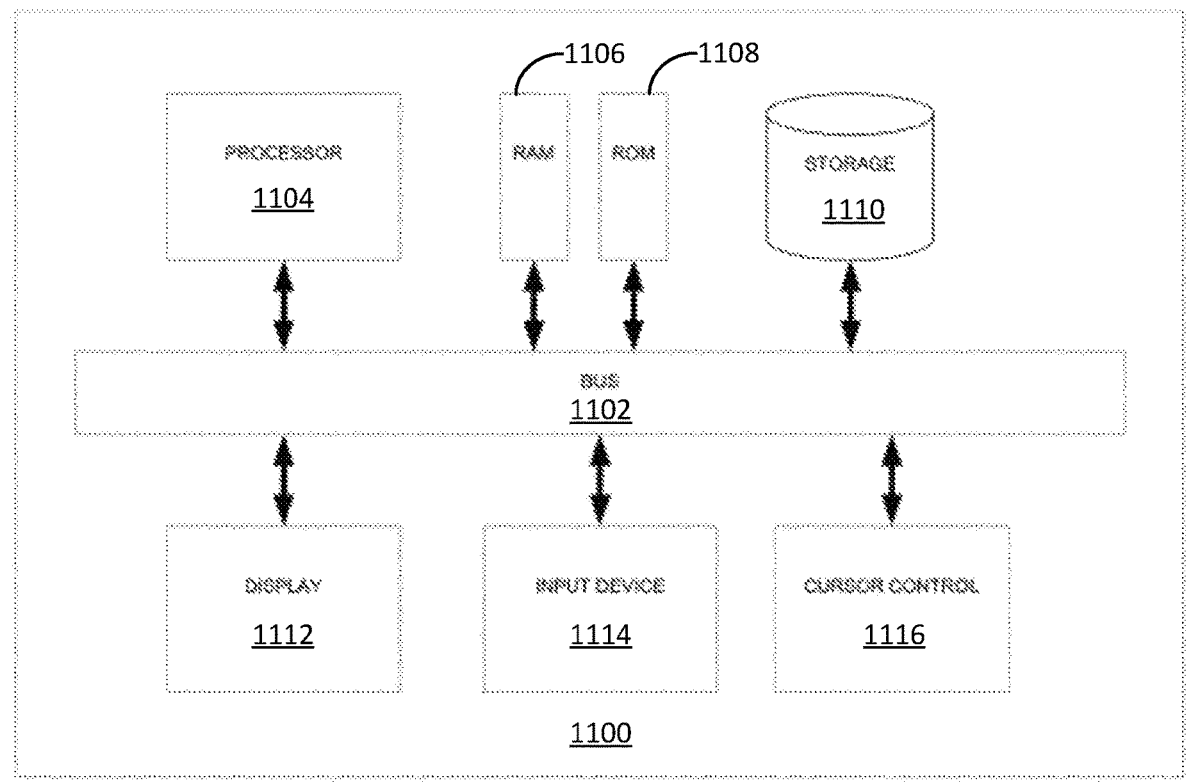
FIG. 10 illustrates an example of an electronic device which may be used to implement some of the examples.

FIG. 10 illustrates an example of an electronic device which may be used to implement some of the examples. In some implementations, the electronic device of FIG. 10 can store or use a computer program product including one or more non-transitory computer-readable media having computer programs instructed stored therein, the computer program instructions being configured such that, when executed by one or more computing devices, the computer program instructions cause the one or more computing devices to perform the techniques described herein.

In FIG. 10, computer system 1100 can implement any of the methods or techniques described herein. For example, computer system 1100 can implement controller 705 in FIG. 7. Thus, the operation of components of the associated mass spectrometer may be adjusted in accordance with calculations or determinations made by computer system 1100. In various embodiments, computer system 1100 can include a bus 1102 or other communication mechanism for communicating information, and a processor 1104 coupled with bus 1102 for processing information. In various embodiments, computer system 1100 can also include a memory 1106, which can be a random-access memory (RAM) or other dynamic storage device, coupled to bus 1102, and instructions to be executed by processor 1104. Memory 1106 also can be used for storing temporary variables or other intermediate information during execution of instructions to be executed by processor 1104. In various embodiments, computer system 1100 can further include a read only memory (ROM) 1108 or other static storage device coupled to bus 1102 for storing static information and instructions for processor 1104. A storage device 1110, such as a magnetic disk or optical disk, can be provided and coupled to bus 1102 for storing information and instructions.

In various embodiments, computer system 1100 can be coupled via bus 1102 to a display 1112, such as a cathode ray tube (CRT) or liquid crystal display (LCD), for displaying information to a computer user. An input device 1114, including alphanumeric and other keys, can be coupled to bus 1102 for communicating information and command selections to processor 1104. Another type of user input device is a cursor control 1116, such as a mouse, a trackball or cursor direction keys for communicating direction information and command selections to processor 1104 and for controlling cursor movement on display 1112. This input device typically has two degrees of freedom in two axes, a first axis (i.e., x) and a second axis (i.e., y), that allows the device to specify positions in a plane.

A computer system 1100 can perform the techniques described herein. Consistent with certain implementations, results can be provided by computer system 1100 in response to processor 1104 executing one or more sequences of one or more instructions contained in memory 1106. Such instructions can be read into memory 1106 from another computer-readable medium, such as storage device 1110. Execution of the sequences of instructions contained in memory 1106 can cause processor 1104 to perform the processes described herein. In various embodiments, instructions in the memory can sequence the use of various combinations of logic gates available within the processor to perform the processes describe herein. Alternatively hard-wired circuitry can be used in place of or in combination with software instructions to implement the present teachings. In various embodiments, the hard-wired circuitry can include the necessary logic gates, operated in the necessary sequence to perform the processes described herein. Thus implementations described herein are not limited to any specific combination of hardware circuitry and software.

The term "computer-readable medium" as used herein refers to any media that participates in providing instructions to processor 1104 for execution. Such a medium can take many forms, including but not limited to, non-volatile media, volatile media, and transmission media. Examples of non-volatile media can include, but are not limited to, optical or magnetic disks, such as storage device 1110. Examples of volatile media can include, but are not limited to, dynamic memory, such as memory 1106. Examples of transmission media can include, but are not limited to, coaxial cables, copper wire, and fiber optics, including the wires that comprise bus 1102.

Common forms of non-transitory computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, PROM, and EPROM, a FLASH-EPROM, any other memory chip or cartridge, or any other tangible medium from which a computer can read.

In accordance with various embodiments, instructions configured to be executed by a processor to perform a method are stored on a computer-readable medium. The computer-readable medium can be a device that stores digital information. For example, a computer-readable medium includes a compact disc read-only memory (CD-ROM) as is known in the art for storing software. The computer-readable medium is accessed by a processor suitable for executing instructions configured to be executed.

In various embodiments, the methods of the present teachings may be implemented in a software program and applications written in conventional programming languages such as C, C++, etc.

While the techniques are described in conjunction with various implementations or embodiments, it is not intended that the techniques be limited to such embodiments. On the contrary, the techniques encompass various alternatives, modifications, and equivalents, as will be appreciated by those of skill in the art.

Further, in describing various embodiments, the specification may have presented a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the various embodiments.

The embodiments described herein, can be practiced with other computer system configurations including hand-held devices, microprocessor systems, microprocessor-based or programmable consumer electronics, minicomputers, mainframe computers and the like. The embodiments can also be practiced in distributing computing environments where tasks are performed by remote processing devices that are linked through a network.

It should also be understood that the embodiments described herein can employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations that form part of the embodiments described herein are useful machine operations. The embodiments, described herein, also relate to a device or an apparatus for performing these operations. The systems and methods described herein can be specially constructed for the required purposes or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Certain embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

We claim:

1. An apparatus, comprising:
    an amplifier circuit configured to cause a radio frequency (RF) signal to drive a quadrupole mass analyzer based on an amplifier RF input signal;
    an inductor coil disposed between the amplifier circuit and the quadrupole mass analyzer, and the inductor coil configured to generate the RF signal;
    an analog-to-digital converter (ADC) configured to generate a digital representation of the RF signal; and
    a controller circuit configured to receive the digital representation of the RF signal and adjust an amplitude of the amplifier RF input signal responsive to a determination that an amplitude of a fundamental frequency of the RF signal is different than an expected amplitude.

2. The apparatus of claim 1, wherein the determination that the amplitude of the fundamental frequency of the RF signal is different than the expected amplitude includes applying a digital signal processing (DSP) technique to transform the digital representation of the RF signal to a frequency domain, and the amplitude of the fundamental frequency is identified from frequency components including harmonics of the RF signal.

3. The apparatus of claim 2, wherein the DSP technique is a discrete cosine transform (DCT).

4. The apparatus of claim 1, wherein the expected amplitude is an amplitude of the amplifier RF input signal.

5. The apparatus of claim 1, wherein the controller circuit is configured to identify a phase difference between the RF signal and the amplifier RF input signal, and adjust a frequency of the amplifier RF input signal based on the phase difference.

6. The apparatus of claim 1, wherein the controller circuit is configured to identify an amount of harmonic content of the RF signal, and adjust a frequency of the amplifier RF input signal based on the amount of harmonic content.

7. The apparatus of claim 1, wherein the controller circuit is configured to identify a harmonic of the RF signal at a first frequency, and generate an out-of-phase signal with respect to the harmonic at the first frequency onto the amplifier RF input signal to attenuate the harmonic of the RF signal.

8. An apparatus, comprising:
an amplifier circuit configured to cause a radio frequency (RF) signal to drive a component of a mass analyzer based on an amplifier RF input signal;
an inductor coil disposed between the amplifier circuit and the component of the mass analyzer, and the inductor coil configured to generate the RF signal;
an analog-to-digital converter (ADC) configured to generate a digital representation of the RF signal; and
a controller circuit configured to receive the digital representation of the RF signal and adjust an amplitude of the amplifier RF input signal responsive to a determination that an amplitude of a fundamental frequency of the RF signal is different than an expected amplitude.

9. The apparatus of claim 8, wherein the determination that the amplitude of the fundamental frequency of the RF signal is different than the expected amplitude includes applying a digital signal processing (DSP) technique to transform the digital representation of the RF signal to a frequency domain, and the amplitude of the fundamental frequency is identified from frequency components including harmonics of the RF signal.

10. The apparatus of claim 9, wherein the DSP technique is a discrete cosine transform (DCT).

11. The apparatus of claim 8, wherein the expected amplitude is an amplitude of the amplifier RF input signal.

12. The apparatus of claim 8, wherein the controller circuit is configured to identify a phase difference between the RF signal and the amplifier RF input signal, and adjust a frequency of the amplifier RF input signal based on the phase difference.

13. The apparatus of claim 8, wherein the controller circuit is configured to identify an amount of harmonic content of the RF signal, and adjust a frequency of the amplifier RF input signal based on the amount of harmonic content.

14. The apparatus of claim 8, wherein the controller circuit is configured to identify a harmonic of the RF signal at a first frequency, and generate an out-of-phase signal with respect to the harmonic at the first frequency onto the amplifier RF input signal to attenuate the harmonic of the RF signal.

15. The apparatus of claim 8, wherein the component is a multipole assembly.

16. The apparatus of claim 15, wherein the component is a quadrupole mass analyzer.

17. A method, comprising:
generating a radio frequency (RF) signal to drive a component of a mass analyzer based on an amplifier RF input signal, the RF signal generated by an inductor disposed between the component of the mass analyzer and an amplifier circuit, the amplifier RF input signal provided to the amplifier circuit;
generating a digital representation of the RF signal;
determine that an amplitude of a fundamental frequency of the RF signal is different than an expected amplitude; and
adjust an amplitude of the RF input signal responsive to the determination that the amplitude of the fundamental frequency of the RF signal is different than the expected amplitude.

18. The method of claim 17, wherein the component is a multipole assembly.

* * * * *